US010796931B2

(12) United States Patent
Lin et al.

(10) Patent No.: US 10,796,931 B2
(45) Date of Patent: Oct. 6, 2020

(54) MANUFACTURING METHOD OF PACKAGE STRUCTURE

(71) Applicant: Powertech Technology Inc., Hsinchu County (TW)

(72) Inventors: Han-Wen Lin, Hsinchu County (TW); Hung-Hsin Hsu, Hsinchu County (TW); Shang-Yu Chang Chien, Hsinchu County (TW); Nan-Chun Lin, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 16/724,387

(22) Filed: Dec. 23, 2019

(65) Prior Publication Data

US 2020/0126815 A1 Apr. 23, 2020

Related U.S. Application Data

(62) Division of application No. 15/644,831, filed on Jul. 10, 2017.

(51) Int. Cl.
*H01L 21/56* (2006.01)
*H01L 23/00* (2006.01)
(Continued)

(52) U.S. Cl.
CPC ...... *H01L 21/568* (2013.01); *H01L 23/49816* (2013.01); *H01L 24/04* (2013.01);
(Continued)

(58) Field of Classification Search
CPC . H01L 21/4828; H01L 21/561; H01L 21/565; H01L 21/568; H01L 21/4842; H01L 21/77; H01L 21/768
See application file for complete search history.

(56) References Cited

U.S. PATENT DOCUMENTS

| 2017/0077047 | A1* | 3/2017 | Lee | H01L 21/56 |
| 2017/0194293 | A1* | 7/2017 | Chang | H01L 21/568 |
| 2018/0145013 | A1* | 5/2018 | Truhitte | H01L 21/561 |

FOREIGN PATENT DOCUMENTS

| CN | 103681534 | 3/2014 |
| CN | 105280575 | 1/2016 |

OTHER PUBLICATIONS

"Office Action of China Counterpart Application", dated Jun. 9, 2020, pp. 1-7.

* cited by examiner

*Primary Examiner* — Cuong Q Nguyen

(74) *Attorney, Agent, or Firm* — JCIPRNET

(57) ABSTRACT

A manufacturing method of a package structure is described. The method includes at least the following steps. A carrier is provided. A semiconductor die and a sacrificial structure are disposed on the carrier. The semiconductor die is electrically connected to the bonding pads on the sacrificial structure through a plurality of conductive wires. As encapsulant is formed on the carrier to encapsulate the semiconductor die, the sacrificial structure and the conductive wires. The carrier is debonded, and at least a portion of the sacrificial structure is removed through a thinning process. A redistribution layer is formed on the semiconductor die and the encapsulant. The redistribution layer is electrically connected to the semiconductor die through the conductive wires.

15 Claims, 14 Drawing Sheets

(51) Int. Cl.
*H01L 25/065* (2006.01)
*H01L 23/498* (2006.01)
*H01L 23/31* (2006.01)

(52) U.S. Cl.
CPC .............. *H01L 24/13* (2013.01); *H01L 24/48* (2013.01); *H01L 24/73* (2013.01); *H01L 24/83* (2013.01); *H01L 24/85* (2013.01); *H01L 24/92* (2013.01); *H01L 24/95* (2013.01); *H01L 24/96* (2013.01); *H01L 24/97* (2013.01); *H01L 25/0657* (2013.01); *H01L 21/561* (2013.01); *H01L 23/3128* (2013.01); *H01L 2224/02379* (2013.01); *H01L 2224/02381* (2013.01); *H01L 2224/04042* (2013.01); *H01L 2224/04105* (2013.01); *H01L 2224/05624* (2013.01); *H01L 2224/13024* (2013.01); *H01L 2224/32145* (2013.01); *H01L 2224/48091* (2013.01); *H01L 2224/48111* (2013.01); *H01L 2224/48227* (2013.01); *H01L 2224/48465* (2013.01); *H01L 2224/73253* (2013.01); *H01L 2224/73265* (2013.01); *H01L 2224/83001* (2013.01); *H01L 2224/83101* (2013.01); *H01L 2224/83191* (2013.01); *H01L 2224/85001* (2013.01); *H01L 2224/95001* (2013.01); *H01L 2225/0651* (2013.01); *H01L 2225/0652* (2013.01); *H01L 2225/06562* (2013.01); *H01L 2924/00014* (2013.01); *H01L 2924/15311* (2013.01); *H01L 2924/181* (2013.01); *H01L 2924/18165* (2013.01); *H01L 2924/19105* (2013.01); *H01L 2924/19106* (2013.01); *H01L 2924/3511* (2013.01)

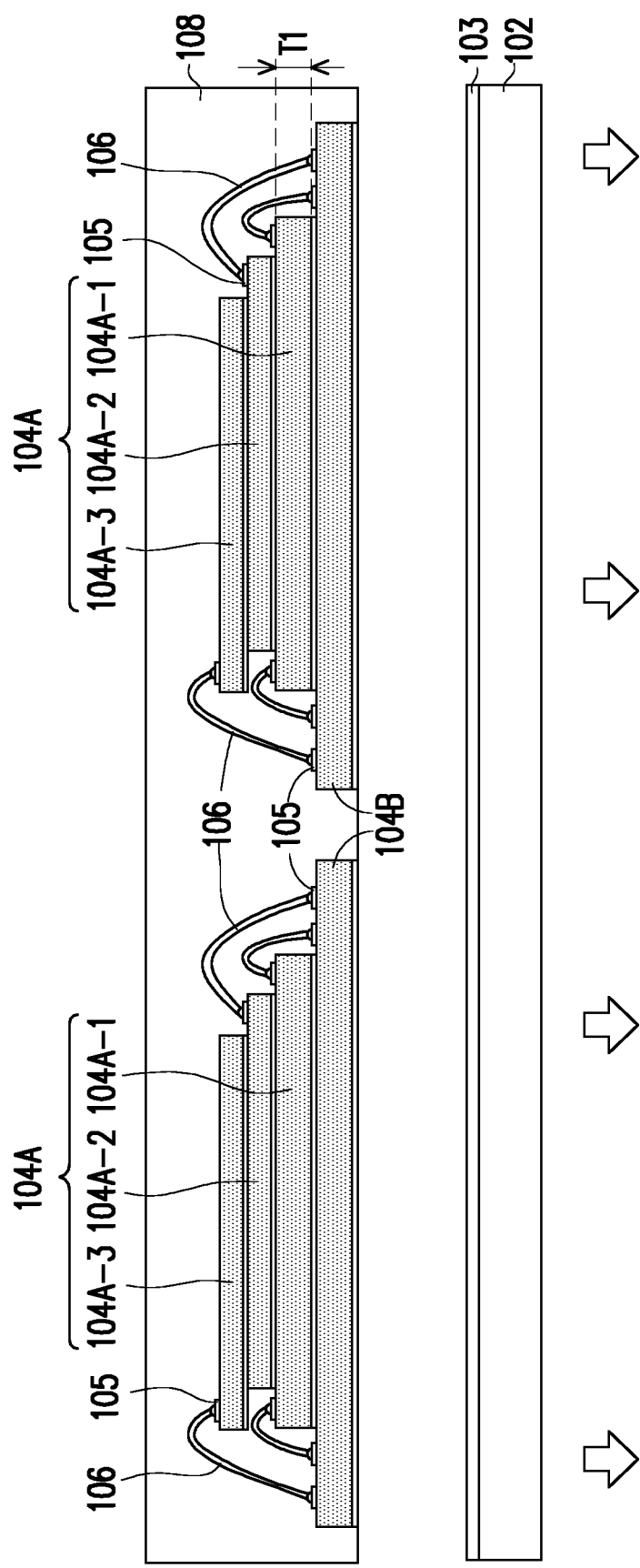

US 10,796,931 B2

MANUFACTURING METHOD OF PACKAGE STRUCTURE

CROSS REFERENCE TO RELATED APPLICATION

This application is a divisional application of and claims the priority benefit of U.S. application Ser. No. 15/644,831, filed on Jul. 10, 2017, now pending. The entirety of the above-mentioned patent application is hereby incorporated by reference herein and made a part of specification.

BACKGROUND OF THE INVENTION

1. Field of the Invention

The present invention generally relates to a package structure, in particular, to a manufacturing method of a package structure using sacrificial structures for wire bonding.

2. Description of Related Art

In order for electronic product design to achieve being light, slim, short, and small, semiconductor packaging technology has kept progressing, in attempt to develop products that are smaller in volume, lighter in weight, higher in integration, and more competitive in market. For example, integrated fan-out packages have become increasingly popular due to their compactness. However, in current fan-out package designs, if a package requires multi-chip stacking, two redistribution layers (RDL) and big pillars are generally required to provide the connection. For such package designs, the manufacturing process is usually complicated, time consuming and an issue of warpage also exist. Therefore, a simplified method/design having lower production cost is desired.

SUMMARY OF THE INVENTION

The invention provides a package structure and a manufacturing method thereof, which uses sacrificial structures to fix the location of a wire for wire bonding. The method effectively reduces the size and manufacturing cost of the package, and overcomes the issue of wafer or panel warpage.

The invention provides a manufacturing method of a package structure. The method includes at least the following steps. A carrier is provided. A semiconductor die and a sacrificial structure are disposed on the carrier. The semiconductor die is electrically connected to bonding pads on the sacrificial structure through a plurality of conductive wires. As encapsulant is formed on the carrier to encapsulate the semiconductor die, the sacrificial structure and the conductive wires. The carrier is debonded, and the sacrificial structure is removed through a thinning process to reveal the bonding pads or the conductive wires. A redistribution layer is formed on the semiconductor die and the encapsulant. The redistribution layer is electrically connected to the semiconductor die through the conductive wires.

The invention further provides a package structure including an encapsulant, a stacked die, a plurality of bonding pads, a plurality of conductive wires, and a redistribution layer. The encapsulant has a top surface and a bottom surface opposite to the top surface. The stacked die is embedded in the encapsulant. The bonding pads are embedded in the encapsulant, wherein the bonding pads are exposed on a top surface of the encapsulant. The conductive wires are embedded in the encapsulant, wherein the stacked die is electrically connected to the bonding pads through the conductive wires. The redistribution layer is disposed on the stacked die and on the top surface of the encapsulant, wherein the redistribution layer is electrically connected to the stacked die through the bonding pads and the conductive wires.

Based on the above, a sacrificial structure is used to fix the position of the conductive wires. As such, when removing the sacrificial structure, the precise location of the wire or weld may be provided for further connection. In addition, a thickness of the semiconductor die may be effectively controlled during the thinning process, thus an overall size of the package structure may be reduced. Furthermore, with the presence of the sacrificial structure, an area ratio between the dies and the encapsulant is decreased. Thus, the issue of wafer or panel warpage may be resolved. Overall, the simplicity of the manufacturing process of the package structure may be realized, thereby reducing the manufacturing cost.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 1G are schematic cross-sectional views illustrating a manufacturing method of a package structure according to an embodiment of the invention.

DESCRIPTION OF THE EMBODIMENTS

Figure 1A:
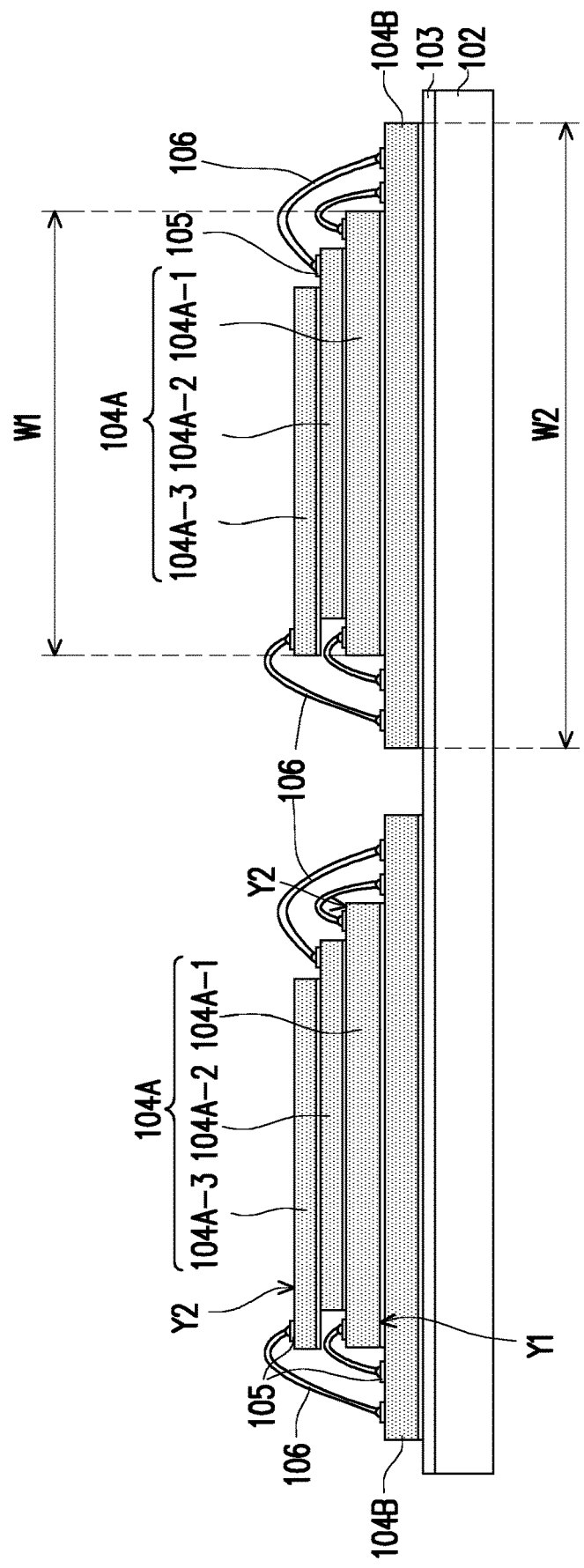

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1G are schematic cross-sectional views illustrating a manufacturing method of a package structure according to an embodiment of the invention. Referring to FIG. 1A, a carrier 102 is provided. The carrier 102 may be a glass substrate or a glass supporting board. In some embodiments, other suitable substrate material may be adapted as the carrier 102 as long as the material is able to withstand the subsequent processes while carrying the package structure formed thereon.

The sacrificial structures 104B are disposed on the carrier 102. The sacrificial structures 104B are, for example, a sacrificial layer to be removed in a subsequent process. Thus, a material of the sacrificial layer is not particularly limited, as long as it can be removed through a thinning process described thereafter. The sacrificial structures 104B are disposed on the carrier 102 through an adhesive layer 103 located on the carrier 102. In some embodiments, the adhesive layer 103 may be a die attach film or formed from adhesive materials including an epoxy resin. The adhesive layer 103 may be formed by methods such as coating, inkjet printing, film attaching or other suitable methods for providing a structural support to eliminate the need for mechanical clamping between the sacrificial structures 104B and the carrier 102.

The semiconductor die 104A is disposed on the carrier 102, and located on the sacrificial structures 104B. In the present embodiment, the semiconductor die 104A is, for example stacked dies that comprise at least a bottom semiconductor die and a top semiconductor die stacked on top of each other. For instance, as shown in FIG. 1A, the semiconductor die 104A includes a first semiconductor die 104A-1, a second semiconductor die 104A-2 and a third semiconductor die 104A-3 stacked on top of each other. The first semiconductor die 104A-1 serve as the bottom semiconductor die, while the third semiconductor die 104A-3 serve as the top semiconductor die, while the second semiconductor die 104A-2 is sandwiched therebetween. However, it construes no limitation in the invention. The number of stacked dies in the semiconductor die 104A is not particularly limited. In some embodiments, a die attach film (DAF; not illustrated) may be disposed between each of the stacked dies to enhance their adhesion. Furthermore, in the present embodiment, the semiconductor die 104A is, for example, an ASIC (Application-Specific Integrated Circuit). However, it construes no limitation in the invention. Other suitable active devices may also be utilized as the semiconductor die 104A.

As shown in FIG. 1A, a width W2 of the sacrificial structure 104B is greater than a width W1 of the semiconductor die 104A. In the case for stacked dies, the width W2 of the sacrificial structure 104B is greater than a width of each of the semiconductor dies (104A-1, 104A-2 and 104A-3). The semiconductor die 104A or the stacked dies each have a first surface Y1 facing the carrier 102 and a second surface Y2 facing away from the carrier 102. Furthermore, bonding pads 105 are provided on the sacrificial structures 104B, and provided on the second surfaces Y2 of the semiconductor die 104A (stacked dies). The bonding pads 105 are, for example, aluminum pads or any other suitable material used for wire bonding. In some embodiments, the bonding pads 105 can be embedded within the sacrificial structures 104B.

Furthermore, as shown in FIG. 1A, a plurality of conductive wires 106 is provided to electrically connect the bonding pads 105 of the semiconductor die 104A to the bonding pads 105 of the sacrificial structures 104B. The conductive wires 106 are, for example, used for wire bonding, and have a curved three-dimensional structure. In some embodiments, the conductive wires 106 are formed after stacking several dies in a group. For example, for multi-die stacking, the conductive wires 106 are used to provide electrical connection after two to four dies are stacked. For instance, in the embodiment shown in FIG. 1A, after disposing the first semiconductor die 104A-1 on the sacrificial structures 104B, and disposing the second semiconductor die 104A-2 on the first semiconductor die 104A-1, the conductive wires 106 are used to electrically connect the bonding pads 105 on the stacked semiconductor dies (104A-1 and 104A-2) to the bonding pads 105 on the sacrificial structure 104B. The process is repeated until all dies are stacked and the electrical connection is established. In some alternative embodiments, the conductive wires 106 are formed after all dies (104A-1, 104A-2 and 104A-3) are stacked.

Figure 1B:
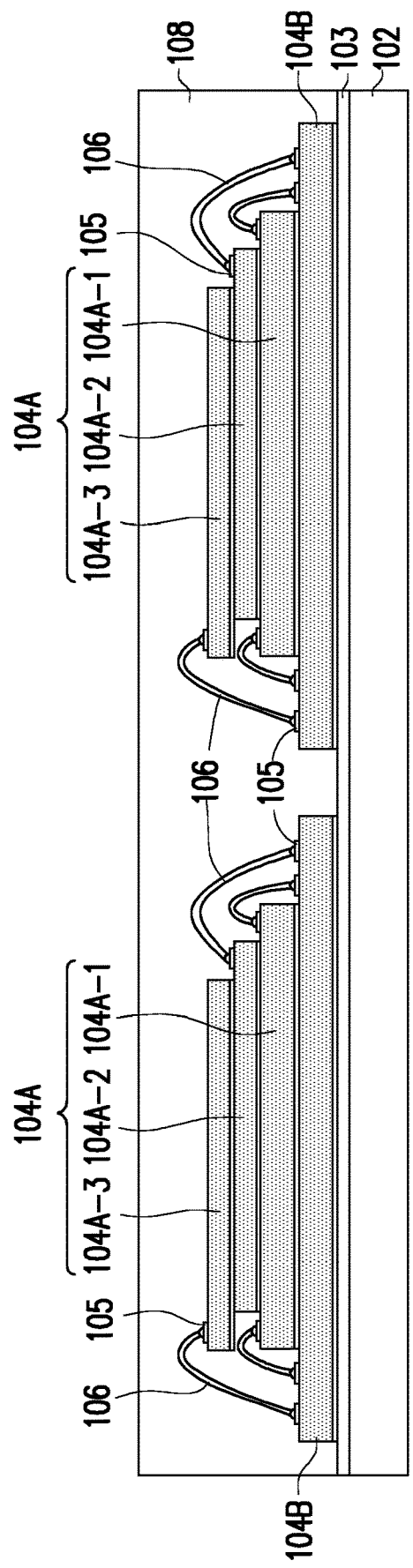

Referring to FIG. 1B, after wire bonding, an encapsulant 108 is formed on the carrier 102 to encapsulate the semiconductor die 104A, the sacrificial structure 104B and the conductive wires 106. The semiconductor die 104A, the sacrificial structures 104B and the conductive wires 106 are completely encapsulated by the encapsulant 108. In some embodiments, the encapsulant 108 may be a molding compound formed by molding processes. However, in some alternative embodiments, the encapsulant 108 may be formed by an insulating material such as epoxy or other suitable resins. In general, when an area ratio of a die to an encapsulant is low, a problem of wafer or panel warpage may occur. As shown in FIG. 1B, by having the sacrificial structure 104B serving as a base structure, an area ratio of the dies (sacrificial structure as dummy die plus the semiconductor die) to the encapsulant 108 is increased. As such, an issue of wafer or panel warpage may be resolved.

Referring to FIG. 1C, the carrier 102 is debonded. That is, the carrier 102 is separated from the encapsulant 108, the semiconductor die 104A, and sacrificial structures 104B. In some alternative embodiments, in order to enhance the releasability of the semiconductor die 104A and sacrificial structures 104B from the carrier 102, a de-bonding layer (not illustrated) may be disposed on the carrier 102 before disposing the dies (104A/104B) on the carrier 102. The de-bonding layer is, for example, a light to heat conversion (LTHC) release layer or other suitable release layers.

Figure 1D:
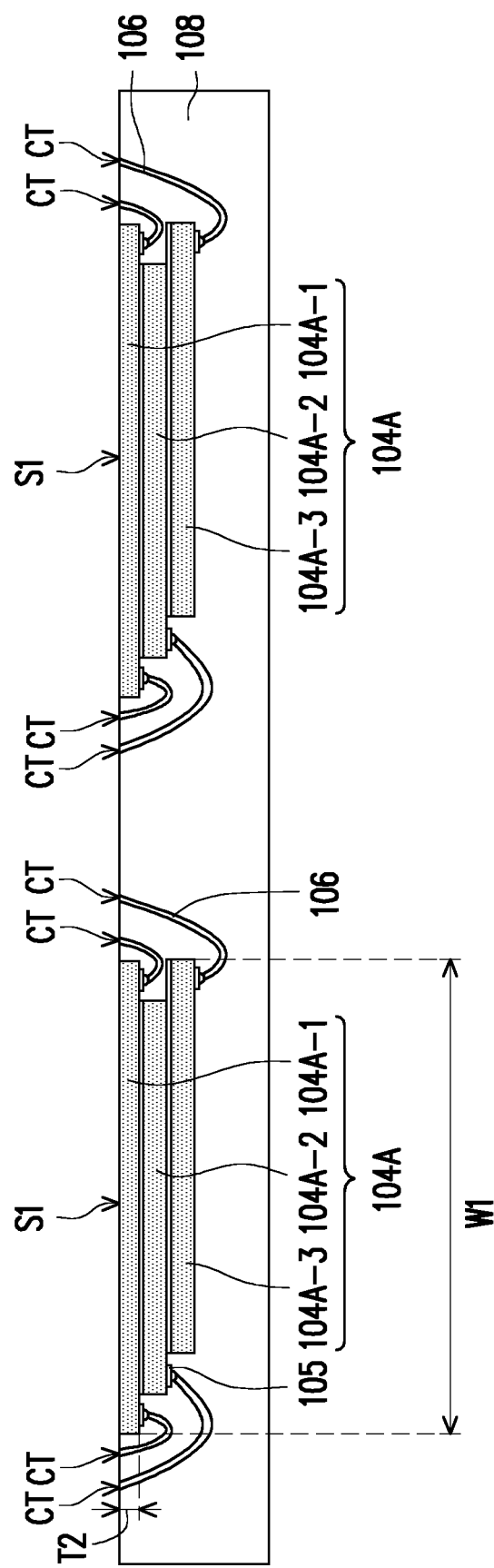

Referring to FIG. 1D, after debonding the carrier 102, the sacrificial structures 104B are removed by a thinning process to reveal/expose the conductive wires 106. Specifically, connection terminals CT of the conductive wires 106 are exposed. In the present embodiment, connection terminals CT may refer to end portions of the conductive wires 106 that are available for further connection. However, it construes no limitation in the invention. In alternative embodiments, the connection terminals CT can be the bonding pads 105 or studs of the conductive wires 106 that are used for further connection. That is, the connection terminals CT are generally treated as "connection points" that connect the conductive wires 106 to a redistribution layer 110 formed thereafter. Wherein, the bonding pads 105 or studs of the conductive wires 106 may have a surface area greater than an area of the cross section of the conductive wires 106.

Referring back to FIG. 1D, the thinning process may be performed through mechanical grinding, chemical mechanical polishing (CMP), or other suitable processes. After the thinning process, the connection terminals CT of the revealed conductive wires 106 are coplanar with a first surface S1 of the semiconductor die 104A. In some embodiments, the thinning process may remove portions of the semiconductor die 104A to form a thinned semiconductor die 104A. For example, in the present embodiment, a portion of the first semiconductor die 104A-1 (or bottom semiconductor die) is partially removed by the thinning process, so that the connection terminals CT (of the conductive wires 106) are coplanar with the first surface S1 of the first semiconductor die 104A-1 (bottom semiconductor die). In other words, a thickness of the first semiconductor die 104A-1 is reduced. In particular, referring to FIG. 1C, the first semiconductor die 104A-1 have a thickness of T1 before the thinning process, whereas in FIG. 1D, a thickness of the first semiconductor die 104A-1 reduces to T2 after the thinning process. From the present embodiment, the thickness of the semiconductor die 104 may be reduced during the thinning process. However, it construes no limitation in the invention. In other embodiments, the thickness of the semiconductor die 104A does not change after the thinning process. In alternative embodiments, the thickness of the semiconductor die 104A may be adjusted based on requirement during the thinning process.

As shown in FIG. 1D, the bonding pads 105 on the sacrificial structures 104B are removed by the thinning process to reveal the conductive wires 106 underneath. That is, the end portions of the conductive wires 106 are treated as the connection terminals CT. However, it construes no limitation in the invention. In alternative embodiments, the bonding pads 105 on the sacrificial structures 104B remain after the thinning process. In such embodiments, the thinning process is performed to reveal the bonding pads 105 on the sacrificial structures 104B, and the revealed portions of the bonding pads 105 serve as the connection terminals CT. Furthermore, the sacrificial structures 104B may be completely removed by the thinning process or residual amounts of the sacrificial structures 104B may remain after the thinning process.

Figure 1E:
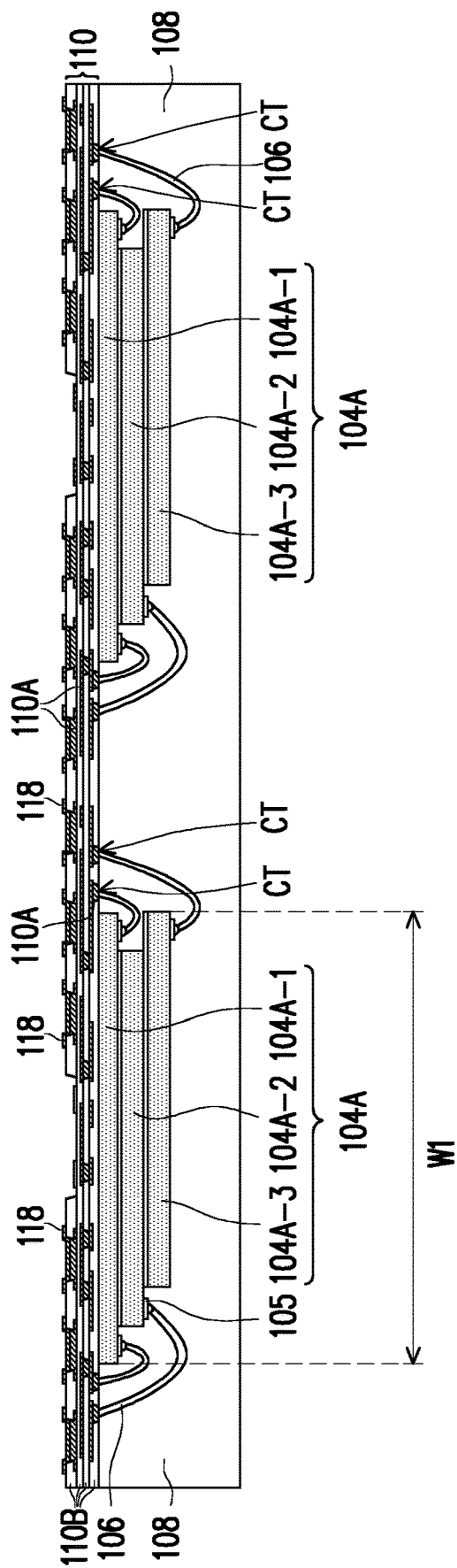

Referring to FIG. 1E, after removing the sacrificial structures 104B through the thinning process, a redistribution layer 110 is formed on the semiconductor die 104A and the encapsulant 108. The redistribution layer 110 may include a plurality of conductive elements 110A and a plurality of dielectric layers 110B alternately formed and stacked on top of each other. As illustrated in FIG. 1E, the redistribution layer 110 includes four dielectric layers 110B. However, the number of the dielectric layer 110B is not limited and may be adjusted based on circuit design. The conductive elements 110A may include a plurality of trace layers and a plurality of interconnect structures connecting the trace layers. Furthermore, in the present embodiment, the redistribution layer 110 is formed on the first surface S1 of the semiconductor die 104A (stacked die). The redistribution layer 110 is electrically connected to the semiconductor die 104A through the conductive wires 106 at the connection terminals CT. In particular, the conductive wires 106 are electrically connected to the conductive elements 110A of the redistribution layer 110 through the connection terminals CT. Conductive terminals 118 are then formed on the redistribution layer 110, and being electrically connected to the conductive elements 110A. The conductive terminals 118 may be a plurality of under-ball metallurgy (UBM) patterns for ball mount or connection pads for mounting of passive components.

Figure 1F:
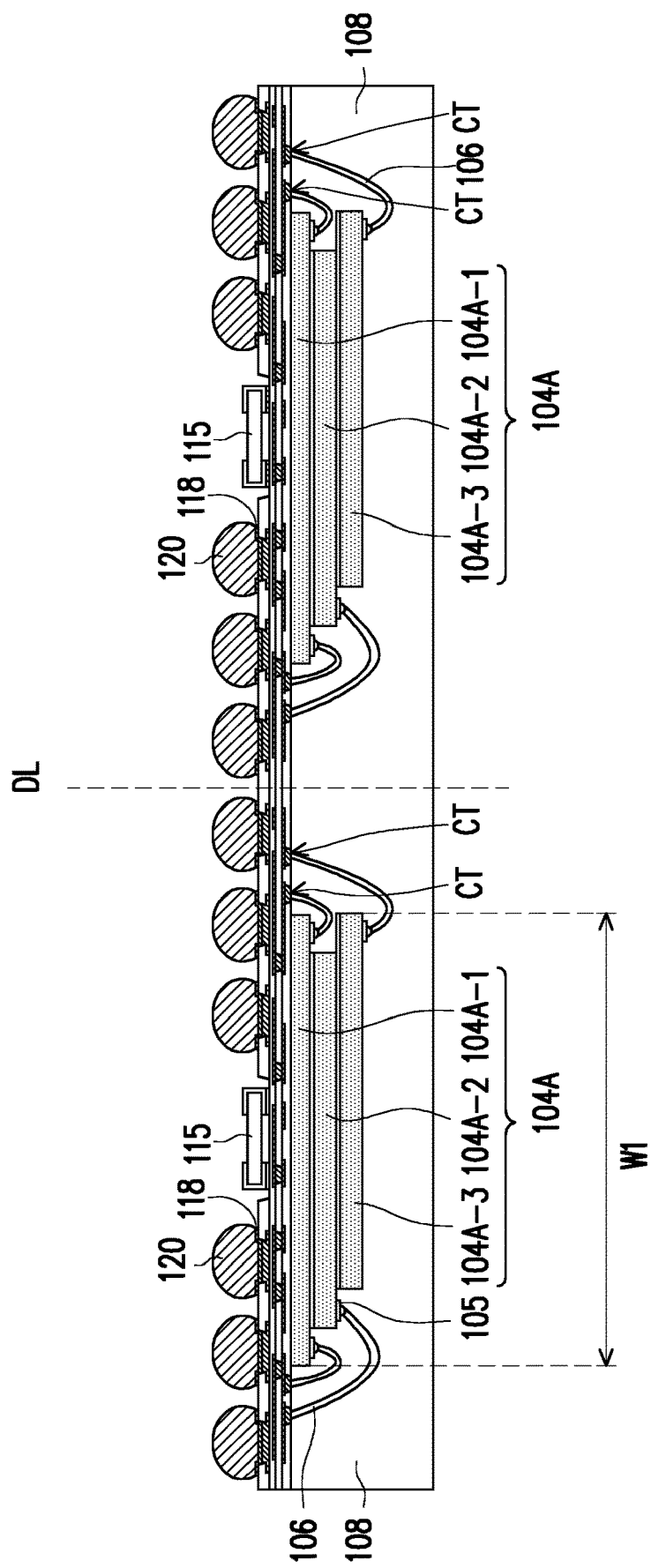
Figure 1G:
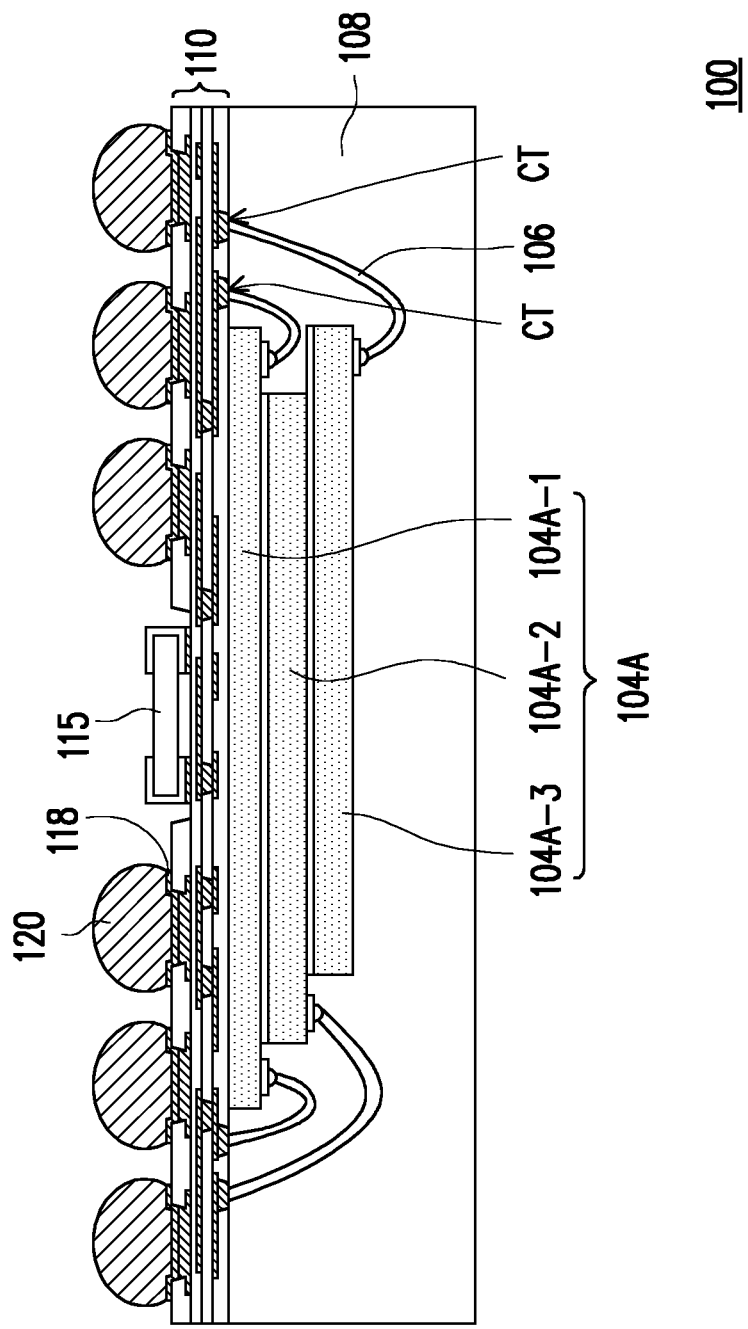

Referring to FIG. 1F, after the formation of the redistribution layer 110 and the conductive terminals 118, a plurality of conductive balls 120 are placed onto the conductive terminals 118, and one or more passive components 115 may be mounted on the conductive terminals 118. The conductive terminals 118 and the conductive balls 120 may, for example, be formed by a ball placement process and a reflow process. The passive components 115 may be mounted on the conductive terminals 118 through a soldering process. Examples of the passive components 115 include capacitors, resistors, inductors, fuses, or antennas. However, they construe no limitation in the invention. After placing the conductive balls 120 and the passive components 115 on the conductive terminals 118, a dicing or singulation process is performed on the package structure illustrated in FIG. 1F to render a plurality of individual packages 100 as shown in FIG. 1G. The dicing process is, for example, performed at the dicing line DL for singulation of the individual packages 100.

FIG. 2A to FIG. 2G are schematic cross-sectional views illustrating a manufacturing method of a package structure according to an embodiment of the invention. The embodiments shown in FIG. 2A to FIG. 2G are similar to the embodiments shown in FIG. 1A to FIG. 1G, therefore, the same reference numerals are used to refer to the same or like parts, and their detailed descriptions are omitted herein. The difference between the embodiments shown in FIG. 2A to FIG. 2G and the embodiments shown in FIG. 1A to FIG. 1G is in the position/design of the sacrificial structures 104B.

Figure 2A:
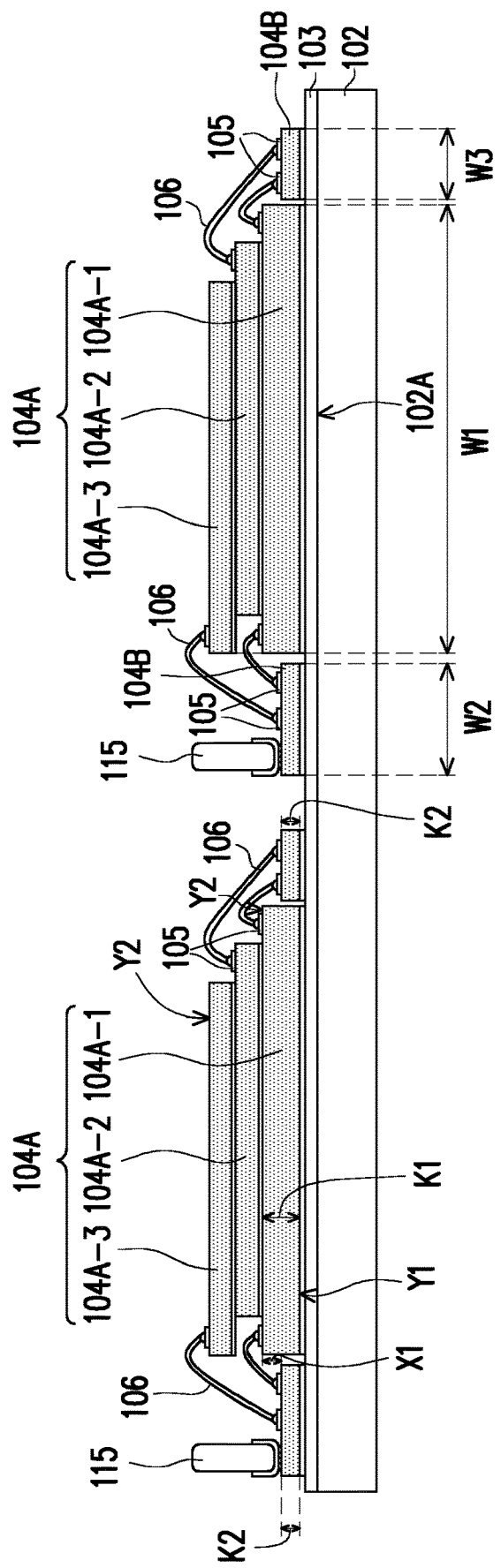
FIG. 2A to FIG. 2G are schematic cross-sectional views illustrating a manufacturing method of a package structure according to an embodiment of the invention.

As shown in FIG. 2A, the semiconductor die 104A and at least one sacrificial structure 104B are disposed on the carrier 102. In the exemplary embodiment, a plurality of the sacrificial structures 104B are disposed on the carrier 102 to surround the semiconductor die 104A. Moreover, the semiconductor die 104A and the sacrificial structures 104B are disposed on a same plane and on a same surface 102A of the carrier 102. In the present embodiment, a width (W2/W3) of the sacrificial structures 102B is smaller than a width W1 of the semiconductor die 104A. The plurality of sacrificial structures 102B may have different widths W2 and W3. However, both of the widths W2 and W3 are smaller than the width W1 of the semiconductor die 104A. Furthermore, a thickness K2 of the sacrificial structures 104B is smaller than a thickness K1 of the semiconductor dies 104A. The thickness K1 of the semiconductor dies 104A refers to the thickness of the first semiconductor die 104A-1 (bottom semiconductor die) of the stacked dies. In the present embodiment, the sacrificial structures 104B is also a sacrificial layer that is removed thereafter. In other words, a thickness difference X1 between the semiconductor die 104A and the sacrificial structures 104B (K1−K2) will determine a thickness of a thinned semiconductor die 104A formed thereafter.

Similar to the embodiments shown in FIG. 1A, bonding pads 105 may be formed on the semiconductor dies 104A and the sacrificial structures 104B to allow for wire bonding. The wire bonding process is, for example, performed after the stacking of several dies in a group, or performed after stacking of all of the dies. In addition, passive components 115 may be disposed on the sacrificial structures 104B. For example, the passive components 115 may be adjacent to the bonding pads 105 and may be disposed on the same surface of the sacrificial structures 104B. Furthermore, a plurality of conductive wires 106 is provided to electrically connect the bonding pads 105 of the semiconductor die 104A to the bonding pads 105 of the sacrificial structures 104B.

Figure 2B:
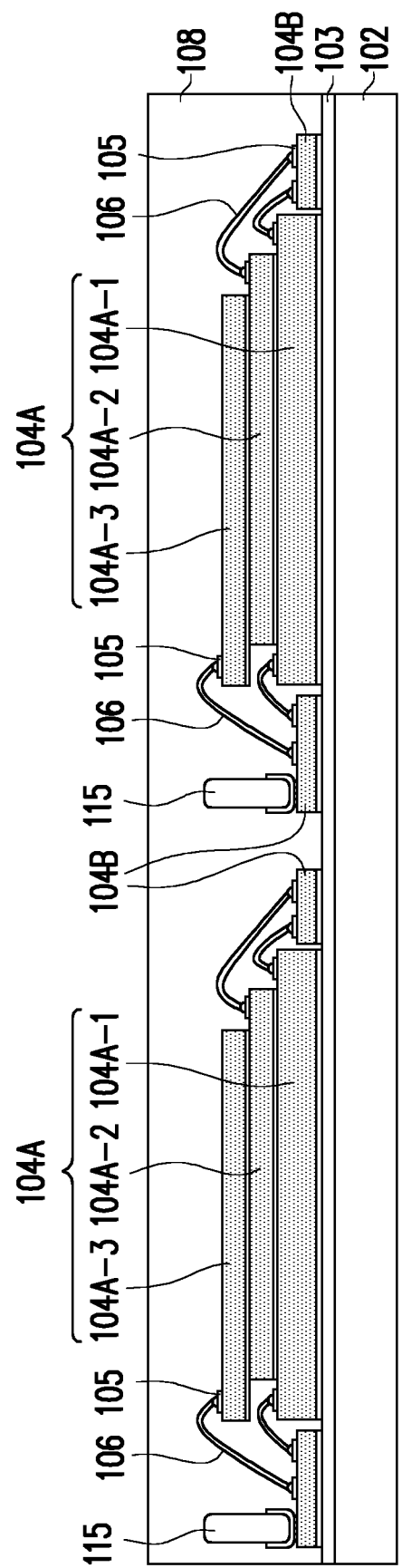

Referring to FIG. 2B, similar to the embodiment shown in FIG. 1B, an encapsulant 108 is formed on the carrier 102 to encapsulate the semiconductor die 104A, the sacrificial structure 104B and the conductive wires 106. However, in the embodiment shown in FIG. 2B, the encapsulant 108 further encapsulates the passive components 115. The semiconductor die 104A, the sacrificial structures 104B, the conductive wires 106 and the passive components 115 are completely encapsulated by the encapsulant 108. As shown in FIG. 2B, by having the sacrificial structures 104B surrounding the semiconductor die 104A, an area ratio of the die (semiconductor dies and sacrificial dummy dies) to the encapsulant 108 is increased. As such, an issue of wafer or panel warpage may be resolved.

Figure 2C:
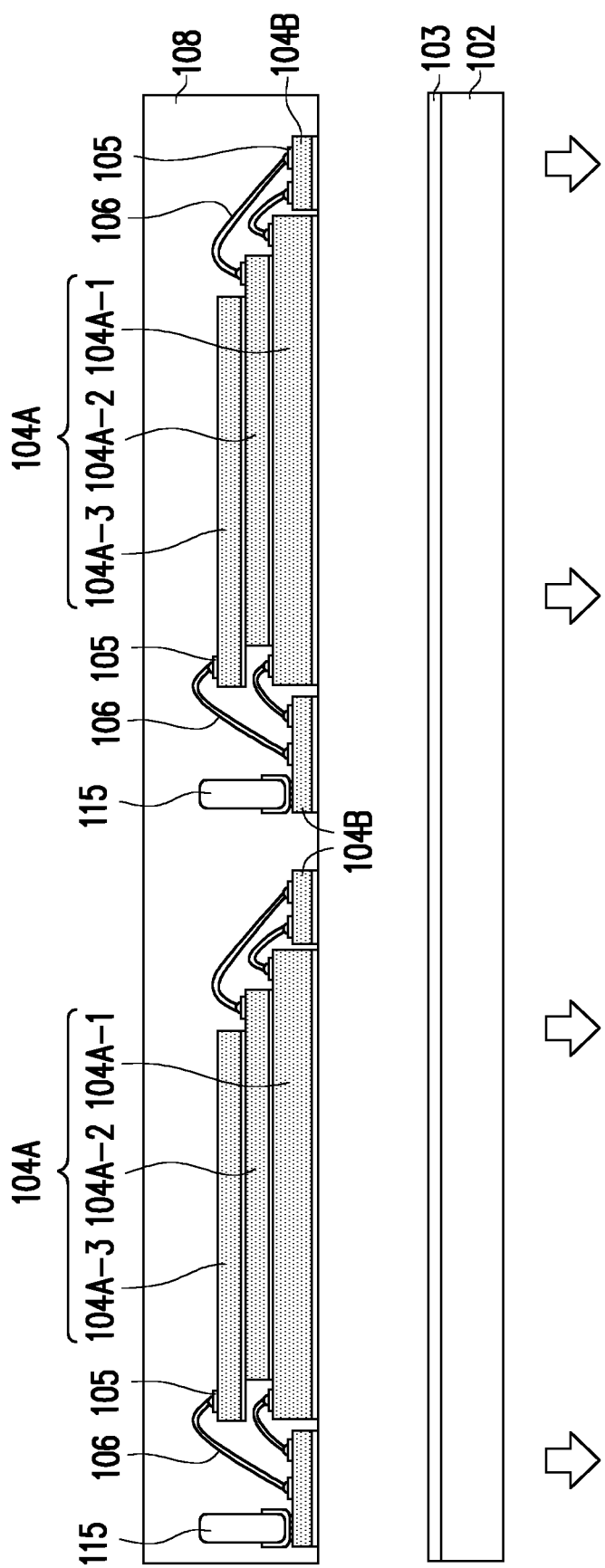

Referring to FIG. 2C, after formation of the encapsulant 108, the carrier 102 are debonded. That is, the carrier 102 is separated from the encapsulant 108, the semiconductor die 104A, and sacrificial structures 104B. In some alternative embodiments, in order to enhance the releasability of the semiconductor die 104A and sacrificial structures 104B from the carrier 102, a de-bonding layer (not illustrated) may be disposed on the carrier 102 before disposing the dies (104A/104B) on the carrier 102. The de-bonding layer is, for example, a light to heat conversion (LTHC) release layer or other suitable release layers.

Figure 2D:
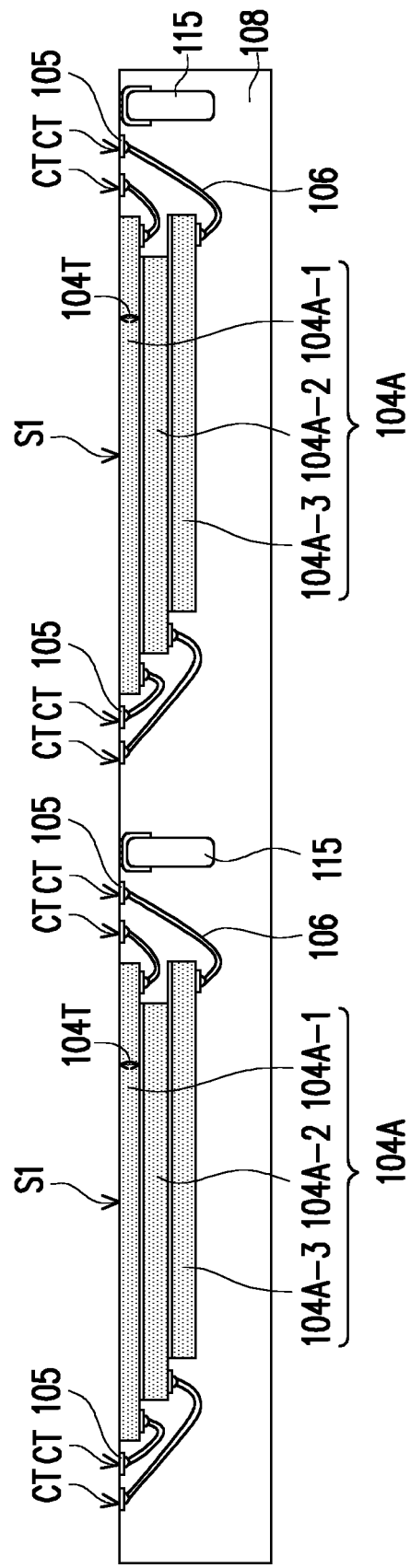

Referring to FIG. 2D, after debonding the carrier 102, the sacrificial structures 104B are removed by a thinning process to reveal/expose the bonding pads 105 on the sacrificial structures 104B. That is, a revealed portion of the bonding pads 105 serve as the connection terminals CT. However, it construes no limitation in the invention. In alternative embodiments, the connection terminals CT can be the end portions (or studs) of the conductive wires 106. That is, the thinning process is performed to reveal/expose the end portions of the conductive wires 106. As noted above, connection terminals CT are generally treated as "connection points" that connect the conductive wires 106 to a redistribution layer 110 formed thereafter. Therefore, the connection terminals CT will apply to all embodiments, and its position may be altered depending on which portion is revealed (wires/pads) for connection.

As shown in FIG. 2D, after the thinning process, the connection terminals CT of the bonding pads 105 are coplanar with a first surface S1 of the semiconductor die 104A. In particular, a portion of the first semiconductor die 104A-1 (or bottom semiconductor die) is removed by the thinning process, so that the connection terminals CT are coplanar with the first surface S1 of the first semiconductor die 104A-1 (bottom semiconductor die). Moreover, a thickness 104T of the thinned semiconductor die (first semiconductor die 104A-1) will correspond to a thickness difference X1 (see FIG. 2A) between the semiconductor die 104A (first semiconductor die 104A-1) and the sacrificial structure 104B before the thinning process.

Figure 2E:
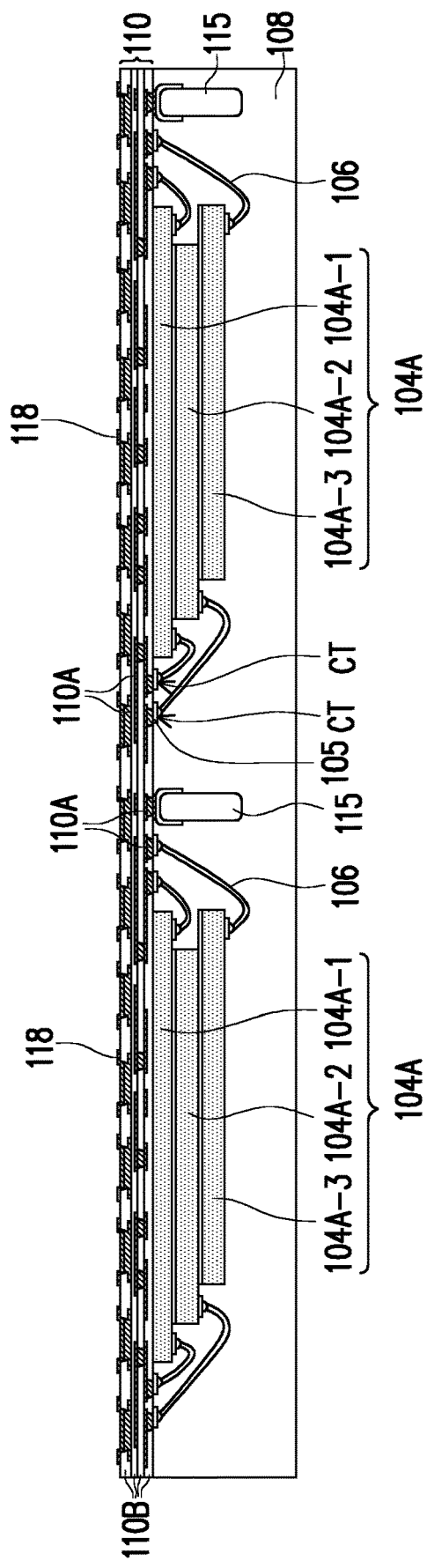

Referring to FIG. 2E, after removing the sacrificial structures 104B through the thinning process, a redistribution layer 110 is formed on the semiconductor die 104A and the encapsulant 108. The redistribution layer 110 of FIG. 2E is similar to the redistribution layer 110 of FIG. 1E, hence its detailed description is omitted herein. In the present embodiment, the redistribution layer 110 is electrically connected to the semiconductor die 104A through the conductive wires 106 at the connection terminals CT. In particular, the conductive wires 106 are electrically connected to the conductive elements 110A of the redistribution layer 110 through the connection terminals CT (of bonding pads 105). Conductive terminals 118 are then formed on the redistribution layer 110, and being electrically connected to the conductive elements 110A.

Figure 2F:
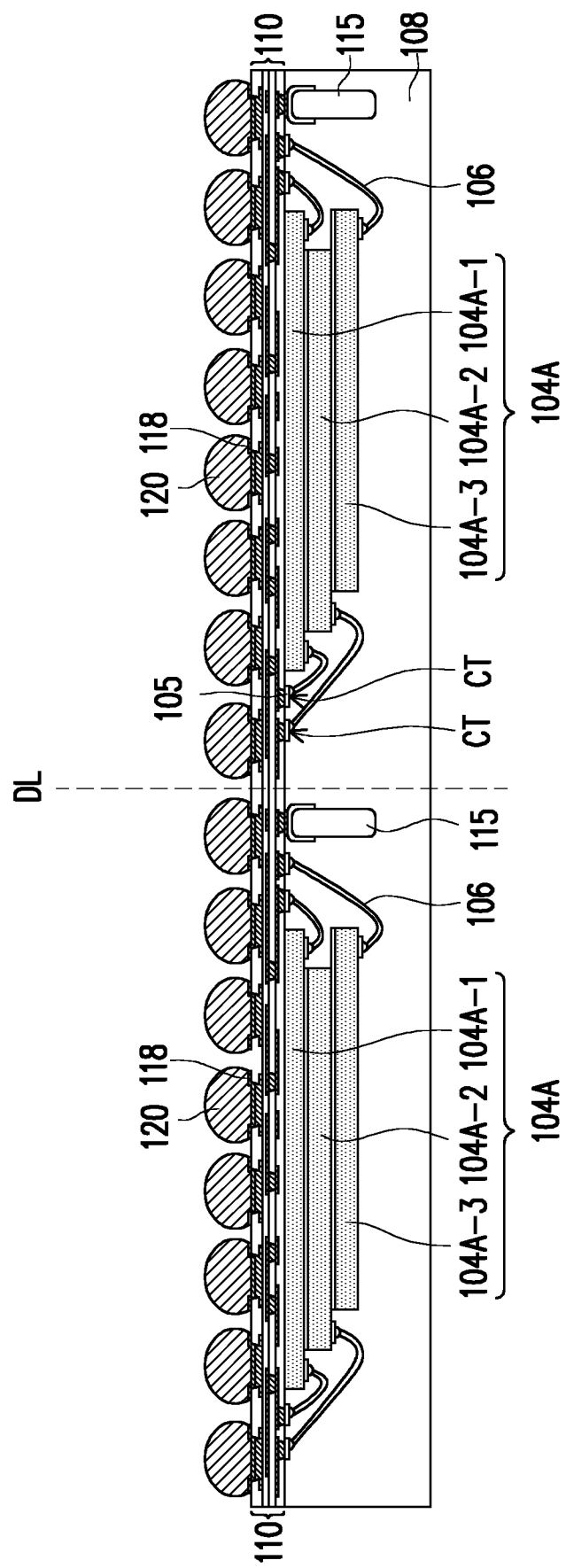
Figure 2G:
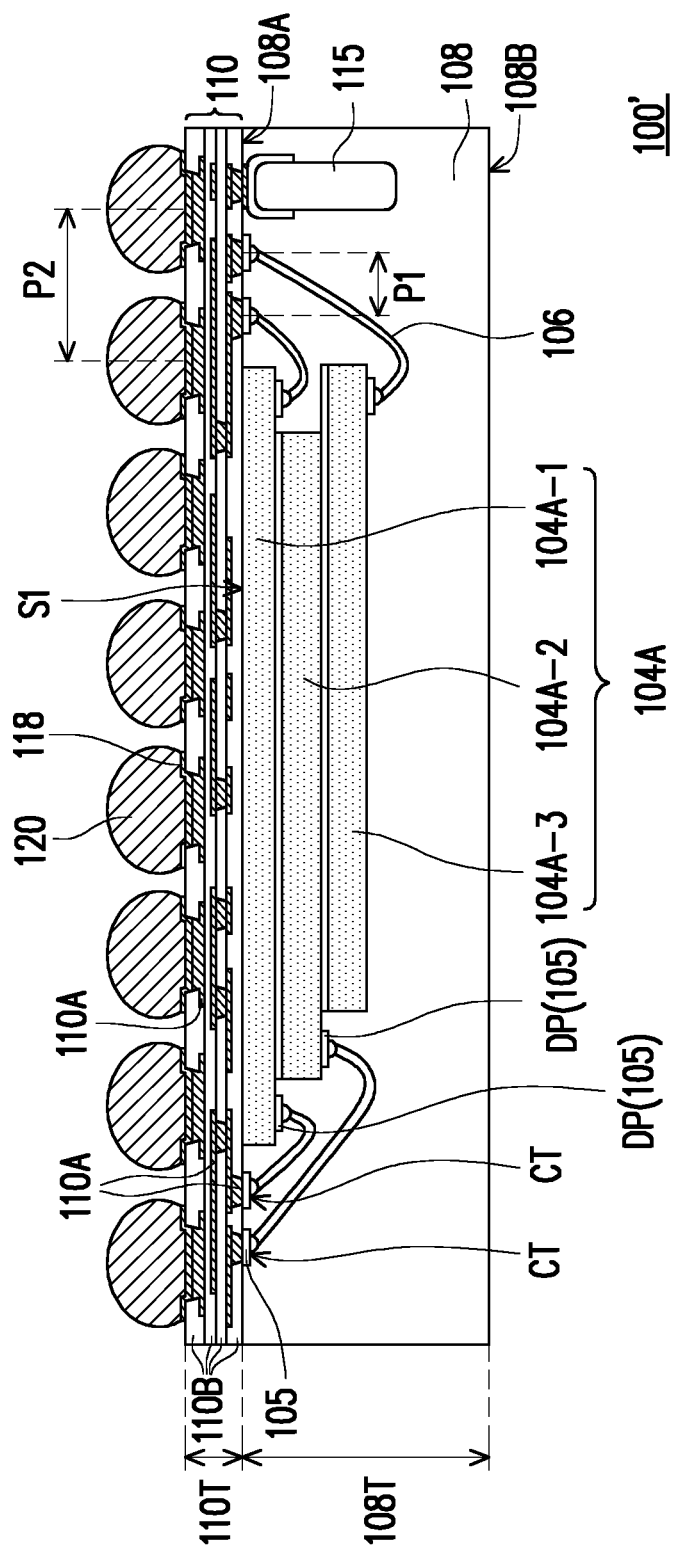

Referring to FIG. 2F, after the formation of the redistribution layer 110 and the conductive terminals 118, a plurality of conductive balls 120 are placed onto the conductive terminals 118. The conductive terminals 118 and the conductive balls 120 may, for example, be formed by a ball placement process and a reflow process. After placing the conductive balls 120 on the conductive terminals 118, a dicing or singulation process is performed on the package structure illustrated in FIG. 2F to render a plurality of individual packages 100' as shown in FIG. 2G. The dicing process is, for example, performed at the dicing line DL for singulation of the individual packages 100'.

Referring to FIG. 2G, the individual packages 100' includes an encapsulant 108, a stacked die 104A, a plurality of bonding pads 105, a plurality of conductive wires 106, a redistribution layer 110 and a plurality of conductive balls 120. The encapsulant 108 has a top surface 108A and a bottom surface 108B opposite to the top surface 108A. The stack die 104A is embedded in the encapsulant 108. The bonding pads 105 are embedded in the encapsulant 108, wherein connection terminals CT of the bonding pads 105 are exposed on a top surface 108A of the encapsulant 108. The conductive wires 106 are embedded in the encapsulant 108, wherein the stacked die 104A is electrically connected to the bonding pads 105 through the conductive wires. The redistribution layer 110 is disposed on the stacked die 104A and on the top surface 108A of the encapsulant 108, wherein the redistribution layer 110 is electrically connected to the stacked die 104A through the bonding pads 105 and the conductive wires 106.

In the exemplary embodiment, the stacked die (semiconductor die 104A) has a first surface S1 exposed through the encapsulant 108. The connection terminals CT of the bonding pads 105 are coplanar with the first surface S1 of the stacked die 104A and the top surface 108A of the encapsulant 108. Furthermore, the stacked die 104A may include a first die (first semiconductor die) 104A-1, a second die (second semiconductor die) 104A-2 and a third die (third semiconductor die) 104A-3. The first die 104A-1 has the first surface S1 exposed through the encapsulant 108. The second die 104A-2 is stacked on the first die 104A-1 opposite to a side of the first surface S1. The second die 104A-2 cover portions of the first die 104A-1, and other portions of the first die 104A-1 not covered by the second die 104A-2 contain die pads DP (bonding pads 105). The die pads DP of the first die 104A-1 are electrically connected to the bonding pads 105 through the conductive wires 106. In addition, the third die 104A-3 is stacked on the second die 104A-2, the third die 104A-3 cover portions of the second die 104A-2, and other portions of the second die 104A-2 not covered by the third die 104A-3 contain die pads DP, the die pads DP of the second die 104A-2 are electrically connected to the bonding pads 105 through the conductive wires 106.

In the embodiment shown in FIG. 2G, the individual packages 100' further includes at least one passive component 115 embedded in the encapsulant 108. However, it construes no limitation in the invention. In alternative embodiments, the passive components 115 may be disposed on the redistribution layer 110. Furthermore, in the exemplary embodiment, the encapsulant 108 has a first thickness 108T, and the redistribution layer 110 has a second thickness 110T smaller than the first thickness 108T. That is, the encapsulant 108 provides a first rigidity, and the redistribution layer 110 provides a second rigidity, wherein the first rigidity is greater than the second rigidity. In addition, the bonding pads 105 are arranged with a first pitch P1 and the conductive balls 120 are arranged with a second pitch P2, the second pitch P2 is greater than the first pitch P1. That is, the individual packages 100' are directed to fan-out packages. The first pitch P1 and the second pitch P2 is calculated based on a center position of the bonding pads 105 and the conductive balls 120.

In the embodiments shown above, the sacrificial structures are used to fix the position of the conductive wires. As such, when removing the sacrificial structure, the precise location of the wire or weld may be provided for further connection.

Furthermore, a thickness of the semiconductor die may be effectively controlled during the thinning process, thus an overall size of the package structure may be reduced. In addition, with the presence of the sacrificial structure, an area ratio between the dies and the encapsulant is decreased. Thus, the issue of wafer or panel warpage may be resolved. Accordingly, the simplicity of the manufacturing process of the package structure may be realized, thereby reducing the overall manufacturing cost.

It will be apparent to those skilled in the art that various modifications and variations can be made to the structure of the present invention without departing from the scope or spirit of the invention. In view of the foregoing, it is intended that the present invention covers modifications and variations of this invention provided fall within the scope of the following claims and their equivalents.

What is claimed is:

1. A manufacturing method of a package structure, comprising:
   providing a carrier;
   disposing a semiconductor die and at least one sacrificial structure on the carrier, wherein a plurality of bonding pads are disposed on the sacrificial;
   electrically connecting the semiconductor die to the bonding pads on the sacrificial structure through a plurality of conductive wires;
   forming an encapsulant on the carrier to encapsulate the semiconductor die, the sacrificial structure and the conductive wires;
   debonding the carrier;
   removing at least a portion of the sacrificial structure through a thinning process; and
   forming a redistribution layer on the semiconductor die and the encapsulant, the redistribution layer is electrically connected to the semiconductor die through the conductive wires.

2. The manufacturing method of a package structure according to claim 1, wherein the thinning process further comprises removing a portion of the encapsulant.

3. The manufacturing method of a package structure according to claim 2, wherein the thinning process further comprises completely removing the sacrificial structure.

4. The manufacturing method of a package structure according to claim 3, wherein the thinning process further comprises completely removing the bonding pads, and the conductive wires are revealed after the thinning process.

5. The manufacturing method of a package structure according to claim 3, wherein the bonding pads or the conductive wires are revealed after the thinning process.

6. The manufacturing method of a package structure according to claim 2, wherein the thinning process further comprises removing a portion of the semiconductor die to form a thinned semiconductor die.

7. The manufacturing method of a package structure according to claim 2, wherein the step of the step of removing at least a portion of the sacrificial structure and a portion of the encapsulant through the thinning process is performed after the step of debonding the carrier, and the step of forming the redistribution layer is performed after the step of removing at least a portion of the sacrificial structure and a portion of the encapsulant through the thinning process.

8. The manufacturing method of a package structure according to claim 7, wherein the step of forming the redistribution layer comprising:
   forming a dielectric layer physically contacted to the semiconductor die and the encapsulant; and
   forming a conductive element disposed on the dielectric layer, wherein a portion of the conductive element penetrates through the dielectric layer for being electrically connected to the conductive wires.

9. The manufacturing method of a package structure according to claim 1, wherein the sacrificial structure is disposed on the carrier, and the semiconductor die is disposed on the sacrificial structure.

10. The manufacturing method of a package structure according to claim 9, wherein a width of the sacrificial structure is greater than a width of the semiconductor die.

11. The manufacturing method of a package structure according to claim 9, wherein the redistribution layer is formed on the semiconductor die and the encapsulant after the removal of the sacrificial structure, and a plurality of passive components are disposed on the redistribution layer.

12. The manufacturing method of a package structure according to claim 1, wherein a plurality of the sacrificial structures are disposed on the carrier to surround the semiconductor die.

13. The manufacturing method of a package structure according to claim 12, wherein the semiconductor die and the sacrificial structures are disposed on a same plane and on a same surface of the carrier.

14. The manufacturing method of a package structure according to claim 12, further comprising:
   forming a plurality of passive components on the sacrificial structures, wherein the encapsulant is formed to encapsulate the passive components.

15. The manufacturing method of a package structure according to claim 14, wherein the redistribution layer is formed on the semiconductor die and the encapsulant after the removal of the sacrificial structure, and the redistribution layer is electrically connected to the semiconductor die and the passive components.

* * * * *